(12) United States Patent
Yoo

(10) Patent No.: US 6,246,031 B1
(45) Date of Patent: Jun. 12, 2001

(54) MINI BATCH FURNACE

(75) Inventor: Woo Sik Yoo, Palo Alto, CA (US)

(73) Assignee: WaferMasters, Inc., San Jose, CA (US)

( * ) Notice: Subject to any disclaimer, the term of this patent is extended or adjusted under 35 U.S.C. 154(b) by 0 days.

(21) Appl. No.: 09/452,361

(22) Filed: Nov. 30, 1999

(51) Int. Cl.⁷ ...................................................... F27B 5/14
(52) U.S. Cl. ........................... 219/390; 118/724; 118/725; 392/416
(58) Field of Search .................................... 219/390, 405, 219/411; 118/724, 725, 50.1; 392/416, 418

(56) References Cited

U.S. PATENT DOCUMENTS

| | | | |
|---|---|---|---|
| 3,737,282 | 6/1973 | Hearn et al. | 432/6 |
| 3,811,829 | 5/1974 | Wesson et al. | 432/253 |
| 4,550,245 | 10/1985 | Arai et al. | 219/405 |
| 4,680,451 | 7/1987 | Gat et al. | 219/411 |
| 4,738,618 | 4/1988 | Massey et al. | 432/241 |
| 4,755,654 | 7/1988 | Crowley et al. | 219/405 |
| 4,857,689 | 8/1989 | Lee | 219/10.71 |
| 4,886,954 | 12/1989 | Yu et al. | 219/390 |
| 5,001,327 * | 3/1991 | Hirasawa et al. | 219/390 |
| 5,114,242 | 5/1992 | Gat et al. | 374/128 |
| 5,155,336 | 10/1992 | Gronet et al. | 219/411 |
| 5,165,796 | 11/1992 | Gat et al. | 374/128 |
| 5,208,643 | 5/1993 | Fair | 356/43 |
| 5,317,492 | 5/1994 | Gronet et al. | 362/294 |
| 5,387,557 | 2/1995 | Takagi | 437/247 |
| 5,418,885 | 5/1995 | Hauser et al. | 392/416 |
| 5,436,172 | 7/1995 | Moslehi | 437/8 |
| 5,444,217 | 8/1995 | Moore et al. | 219/405 |
| 5,482,559 * | 1/1996 | Imai et al. | 118/728 |
| 5,512,320 * | 4/1996 | Turner et al. | 427/255 |
| 5,540,782 | 7/1996 | Miyagi et al. | 118/724 |
| 5,561,735 | 10/1996 | Camm | 392/416 |
| 5,567,152 | 10/1996 | Morimoto | 432/241 |
| 5,584,936 | 12/1996 | Pickering et al. | 118/728 |
| 5,603,772 | 2/1997 | Ide | 118/724 |
| 5,639,301 | 6/1997 | Sasada et al. | 118/52 |

(List continued on next page.)

FOREIGN PATENT DOCUMENTS 62-087500    4/1987   (JP) .............................. C30B/31/12

OTHER PUBLICATIONS

Woo Sik Yoo et al., "Susceptor–Based Rapid Thermal Processing System and Its Silicide Application", Jpn.J.Appl.Phys., vol. 37 (1998) pp. L1135–L1137, Part 2, No. 10A, Oct. 1, 1998.

(List continued on next page.)

Primary Examiner—Teresa Walberg
Assistant Examiner—Shawntina T. Fuqua
(74) Attorney, Agent, or Firm—Skjerven Morrill MacPherson LLP; Theodore P. Lopez

(57) ABSTRACT

A heating apparatus, system, and method for isothermally distributing a temperature across a semiconductor device during processing. The present invention provides a furnace assembly, which includes a processing chamber configured to removably receive a plurality of semiconductor wafers. The invention includes a first heating circuit and a second heating circuit. In accordance with the present invention, the first heating circuit provides a variable temperature, which may be controlled during processing. The second heating circuit provides a constant temperature. The temperature of the first heating circuit can be adjusted to keep the process chamber temperature at the constant and uniform level provided by the second heating circuit. The wafer carrier is positioned vertically within the processing chamber using an actuation mechanism. After the wafers are processed, the actuation mechanism is used to remove the wafer carrier from the process chamber. The wafers can be transported to a cooling chamber, where the wafer cooling process may commence. As the wafer carrier is removed from the process chamber, the process chamber is kept substantially enclosed using insulators, so that the processing temperature within the cavity can be substantially isothermally maintained.

24 Claims, 5 Drawing Sheets

U.S. PATENT DOCUMENTS

| | | | |
|---|---|---|---|
| 5,654,417 | 8/1997 | Tarr et al. | 536/24.32 |
| 5,654,904 | 8/1997 | Thakur | 364/557 |
| 5,683,518 | 11/1997 | Moore et al. | 118/730 |
| 5,715,361 | 2/1998 | Moslehi | 392/416 |
| 5,830,277 | 11/1998 | Johnsgard et al. | 118/752 |
| 5,837,555 | 11/1998 | Kaltenbrunner et al. | 437/248 |
| 5,872,889 | 2/1999 | Kaltenbrunner et al. | 392/418 |

OTHER PUBLICATIONS

Woo Sik Yoo et al., "Highly Reliable, Backside Emissivity Independent Cobalt Silicide Process Using a Susceptor–Based Low Pressure Rapid Thermal Processing System", Jpn.J.Appl.Phys., vol. 37 (1998) pp. L1221–L1223, Part 2, No. 10B, Oct. 15, 1998.

Woo Sik Yoo et al., "Wafer Temperature Characterization in a Susceptor–Based, Low Pressure Rapid Thermal Processing System," 7th Int. Conf. on Advanced Thermal Processing of Semiconductors (RTP '99), Colorado Springs, Sep. 1999, pp. 1–6.

Woo Sik Yoo et al., "Characterization of a Susceptor–Based, Low Pressure RTP System in the Temperature Range of 400–1150° C.", 6th Int. Conf. on Advanced Thermal Processing of Semiconductors (RTP '98), Kyoto, Japan., Sep. 1998, pp. 1–8.

Woo Sik Yoo et al., "Very Thin Cobalt Silicide Formation and Annealing in a Susceptor–Based Low Pressure RTP System," 6th Int. Conf. on Advanced Thermal Processing of Semiconductors (RTP '98), Kyoto, Japan., Sep. 1998, pp. 1–5.

George Chizinsky, "The HotShot Heated–Platen Rapid Thermal Processor", pp. 1–8.

"Rapid Thermal Processing: Equipment, Technology, and Process", American Vacuum Society / New Mexico Chapter, C.B. Yarling, May 23, 1997.

* cited by examiner

MINI BATCH FURNACE

BACKGROUND OF THE INVENTION

1. Field of the Invention

This invention generally relates to semiconductor manufacturing equipment and, more particularly, to an apparatus, system, and method used for thermal processing of semiconductor wafers.

2. Description of the Related Art

During the processing of semiconductor devices, it is highly desirable to very accurately control the thermal treatment to which the devices are exposed during processing. In some instances, batches of devices, primarily wafers, are processed in a semiconductor processing furnace, which has a carefully controlled processing environment to effect the desired processes.

Of importance to the present invention are processing furnaces, which have vertically arranged wafer arrays and processing chambers. Vertically arranged furnaces were designed to provide better control of temperature and other processing parameters. For example, in U.S. Pat. No. 4,738,618, a vertically arranged thermal processor is disclosed having a vertically adjustable furnace assembly and process tube. The process tube, constructed from a quartz bell jar, is vertically moveable in up and down directions within a supporting framework in conjunction with a likewise moveable furnace assembly. Additionally, the furnace assembly and process tube are moveable together between up and down positions, as well as independently of one another. Heat is supplied to the thermal processor when the furnace assembly and process tube are both lowered into the down position by controlling operation of heating elements within the furnace assembly. To cool the process tube within the thermal processor, the operation of the heating elements is regulated, such that interior heat is dissipated to the exterior of the processor by convection.

It is generally desirable in vertically arranged furnaces to achieve a desired temperature environment within the process chamber so that wafers or other semiconductor devices are heated at uniform rates and to uniform temperatures. The more quickly the uniform environment is achieved the less risks of processing variations between wafers and between different batches of wafers. Unfortunately, it has been found that the desired temperature is usually non-uniform throughout the process chamber in all directions relative to the array of wafers being processed. The temperature non-uniformity is typically due to variations in temperature between different regions of the processing chamber. The ability to control these variations in temperature becomes more difficult as faster thermal ramp-up and ramp-down targets are attempted in the process chamber. In general, the conventional arrangement of heating elements used in and/or around the processing chamber creates a delay in thermal response of the process chamber temperature, which makes accurate dynamic control of the temperature during ramp-up, ramp-down, and changing temperature rate conditions particularly difficult.

For the above reasons, what is needed is an apparatus and method for isothermally distributing a temperature across the surface of a semiconductor device which provide an accurate dynamic control of the process temperature, without a degradation in uniformity of the processed wafers.

SUMMARY OF THE INVENTION

The present invention provides a heating apparatus, system, and method for isothermally distributing a temperature across a semiconductor device during processing. The present invention provides a furnace assembly, which includes a processing chamber. The processing chamber defines an internal cavity, which is configured to removably receive a wafer carrier or wafer boat, having a full compliment of semiconductor wafers. As described in greater detail below, a first heating circuit, including a plurality of resistive heating elements, is provided and advantageously arranged to surround the process chamber. A second heating circuit, which may also include a plurality of resistive heating elements, is provided and positioned proximate to the first plurality of heating elements. Preferably, in accordance with the present invention, the first heating circuit provides a variable temperature, which may be controlled during processing by varying the amount of energy emanating from each resistive heating element in response to a temperature fluctuation experienced within the process chamber. The second heating circuit provides a constant temperature distribution, which can be maintained during processing. In this manner, if a fluctuation in the process chamber temperature is sensed, the temperature of the first heating circuit can be adjusted to bring the process chamber temperature back to the constant and uniform heating temperature provided by the second heating circuit. Since the chamber is substantially kept at the desired processing temperatures by the second heating circuit, less energy is needed to adjust the temperature of the first heating circuit.

The wafer carrier is positioned vertically within the processing chamber using an actuation mechanism. After the wafers are processed, the actuation mechanism is used to remove the wafer carrier from the process chamber. The wafer carrier is transported to a cooling chamber, where the wafer cooling process may commence. Advantageously, as the wafer carrier is removed from the process chamber, the internal cavity is kept substantially enclosed using insulators, so that the processing temperature within the cavity can be substantially isothermally maintained. Accordingly, the risks of processing variations occurring between wafers and between different batches of wafers is substantially reduced in subsequent processing operations.

In one aspect of the present invention, a furnace assembly is provided for heating a plurality of substrates. The furnace assembly includes a furnace chamber, which has a process chamber mounted in space relation thereto. The process chamber is configured to receive the plurality of substrates. Also housed within the furnace assembly is a first heating circuit positioned proximate to the process chamber and a second heating circuit positioned proximate to the first heating circuit. A thermal energy output from the first heating circuit and the second heating circuit is capable of creating a substantially isothermal environment throughout the process chamber to heat each of the substrates.

In another aspect of the present invention, a system is provided for heating a plurality of substrates. The system includes a furnace assembly, which is configured to receive a plurality of substrates for processing. The system also includes a cooling chamber, which is configured to receive the plurality of substrates after processing. The furnace chamber remains substantially at a given temperature as the plurality of substrates are transported from a first position, within the furnace chamber and to a second position, within the cooling chamber.

In yet another aspect of the present invention, a method is provided for heating a plurality of substrates, which includes transporting said plurality of substrates to a first position within a process chamber; supplying a thermal energy output from a heat source to create a substantially isothermal environment within said process chamber; and transporting the plurality of substrates from said first position to a second position. The process chamber remains substantially isothermal during the transporting of the plurality of substrates from the first position to the second position.

The furnace assembly, system, and method of the present invention provide many other advantages. For example, since during continuous processing cycles the temperature of the process chamber does not substantially vary, less energy is required to maintain the process temperatures. The life usage of the heating elements is increased, since the heating circuits are not repeatedly ramping-up to load temperatures and ramping-down to cool. The present invention also makes it possible to process numerous wafer batches simultaneously, since while one batch is in the cooling phase of the operation, the process chamber is available to receive and heat treat another wafer batch.

These and other features and advantages of the present invention will be more readily apparent from the detailed description of the embodiments set forth below taken in conjunction with the accompanying drawings.

DETAILED DESCRIPTION

Figure 1:
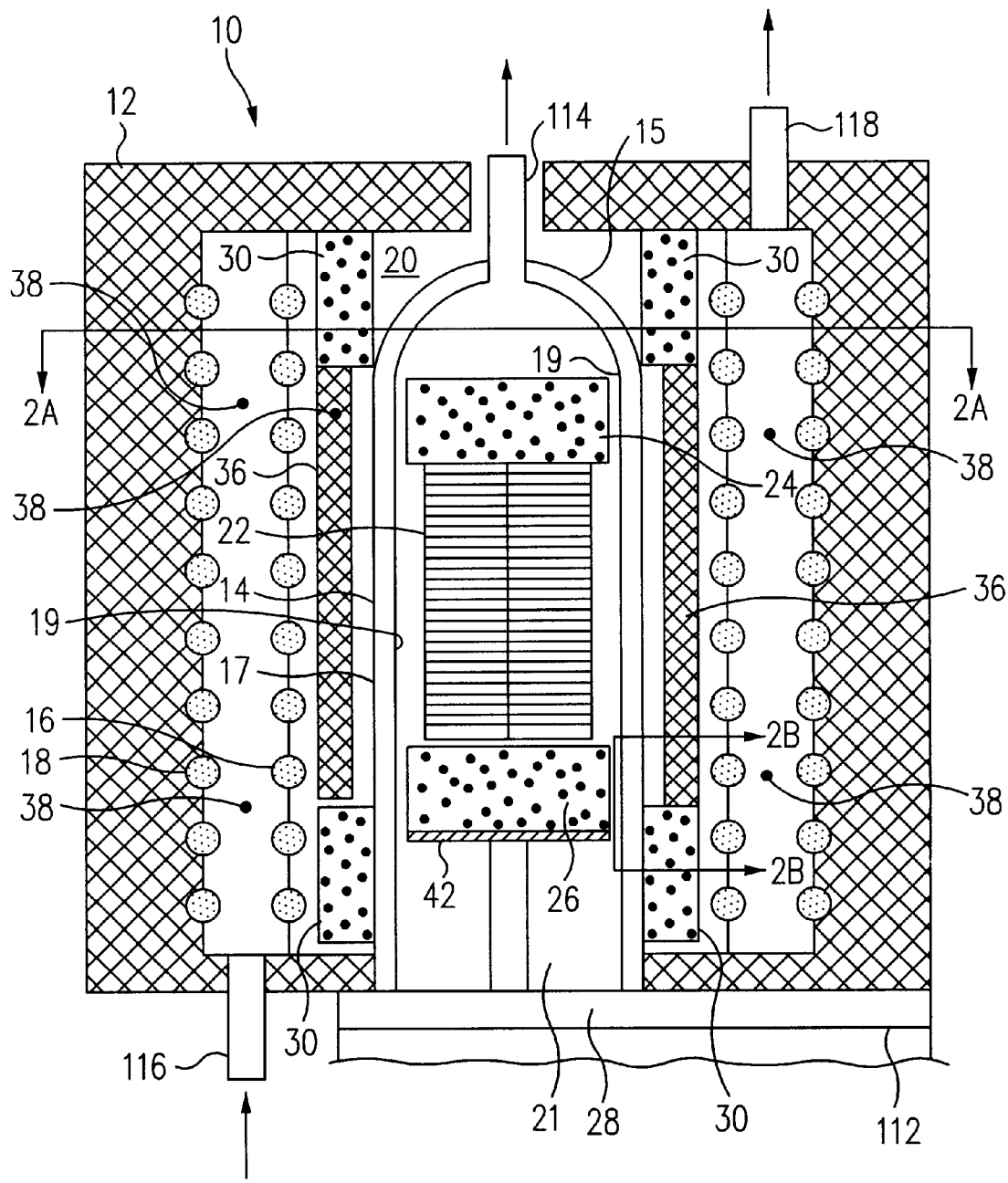
FIG. 1 is a simplified cross-sectional view of one embodiment of the present invention.

FIG. 1 is a simplified cross-sectional view of one embodiment of the furnace assembly 10 of the present invention. Furnace assembly 10 includes a housing 12, which defines an enclosed space 20. Housed within space 20 are process chamber 14, first heating circuit 16, second heating circuit 18, and other structural and insulatory components described below.

Externally, housing 12 may be metallic, preferably made of aluminum, stainless steel, or similar metal. Housing 12 has an opening 28 provided on a face of housing 12, preferably a bottom face, which is configured to receive a wafer carrier or wafer boat, including wafers for processing. Opening or aperture 28 allows for the loading and unloading of wafers from chamber 14 before and after processing. Aperture 28 may be a relatively small opening, but with a width large enough to accommodate a wafer carrier. The relatively small aperture size helps to reduce radiation heat loss from chamber 14. Also, the small aperture size keeps down the number of particles entering chamber 14 and allows for easier maintenance of the isothermal temperature environment.

Optionally, to protect users and/or equipment near housing 12, space 20 may include internal thermal insulation layers. Preferably, the insulation layers may be made of any suitable insulation material, such as a ceramic fiber material. Alternatively, a detachable water cooled jacket or similar device may be used to surround an external portion of housing 12. The water cooled jacket ensures that furnace assembly 10 does not become too hot, so as to be a hazard to nearby equipment or personnel.

Process chamber 14 is preferably mounted within internal space 20, of housing 12. Process chamber 14, also referred to as a processing tube or jar, is preferably shaped in a form similar to a bell jar. The jar shaped chamber has a shell 15 with an outer surface 17 and an inner surface 19. Inner surface 19 defines the perimeter of the process chamber and an interior cavity 21. Interior cavity 21, is constructed with a minimal internal volume to surround a wafer carrier holding a batch of wafers. Typically, chamber 14 may withstand internal pressures of about 0.001 Torr to 1000 Torr, preferably between about 0.1 Torr and about 760 Torr. Thermal heat treatment can be done within chamber 14 alone or with other processing steps involving exposing the semiconductor wafers to various chemicals, particularly gases, as is well-known in the art. During processing, processing chamber 14 can be supplied with the desired processing gases via tube 112. The outflowing gases are discharged through discharge tube 114. The remaining portion of internal space 20 outside of chamber 14, may be filled with a gas, for example, air, or preferably, $N_2$ or $O_2$, gases. Using pure gases to fill space 20 may help to extend the usage life of the components housed in space 20, for example, the heating elements. For example, the gas may enter space 20 at tube 116 and may be expelled at tube 118. Process jar 14 is preferably made from quartz or other similar material.

As illustrated in FIG. 1, a wafer carrier or wafer boat 22 is provided, which is capable of holding a plurality of wafers in a vertical array for processing. Wafer carrier 22 is formed of quartz or other suitable materials. Process chamber 14 and wafer carrier 22 are constructed to form a coaxial arrangement, such that wafer carrier 22 can be removably received within process chamber 14, as described in more detail below. Wafer carrier 22 has a series of wafer receivers, advantageously formed by notches, each notch being capable of holding a wafer in position during processing. The wafer carrier can be designed to hold any desired number of wafers, but preferably the wafer carrier can hold between about 25 and 50 wafers. Wafer carrier 22 may be a removable cassette which is loaded into process chamber 14, either manually or with automated guided vehicles (AGV). Wafer carrier 22 may also be a fixed cassette, in which case wafers are loaded onto carrier 22 using conventional atmospheric robots or loaders. In one embodiment, wafer carrier 22 may be configured for vertical movement to allow the wafer array to be installed and/or removed from process chamber 14.

Positioned on a top portion and a bottom portion of process chamber 14 are first cavity insulator 24 and second cavity insulator 26, respectively. As best understood with reference to the operational system shown in FIGS. 4A and 4B, insulators 24 and 26 are configured to slidably move within process chamber 14, to create a substantially enclosed processing chamber during the removal or installation of wafer carrier 22. For example, when carrier 22 is deployed upwardly and positioned within process chamber 14 (FIG. 4A), second insulator 26 covers chamber opening 28 and seals against the bottom perimeter of the chamber to form a substantially enclosed process chamber 14. In this manner, the environmental processing temperature can be substantially maintained. Conversely, when carrier 22 is deployed downwardly from chamber 14 (FIG. 4B), first insulator 24 remains to seal against the bottom perimeter of the chamber to prevent heat from leaking out of process chamber 14. The environmental temperature achieved during processing can be substantially maintained to reduce the need to re-heat process chamber 14 during subsequent processing operations. Insulators 24 and 26 may be made of a highly insulatory material, such as opaque quartz, fibered ceramic material or other types of ceramic fibers, which are matted together to form a relatively less dense layer having good thermal insulation properties.

Figure 2A:
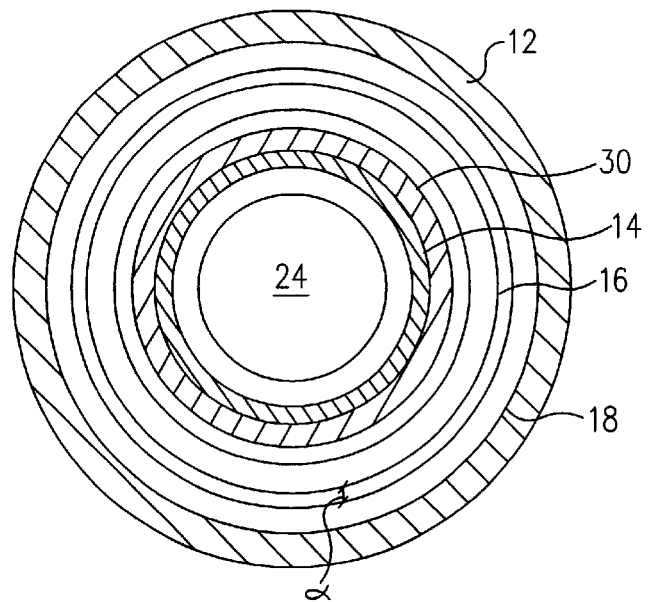
FIG. 2A is a sectional view of a portion of the embodiment of FIG. 1 where the first heating circuit and the second heating circuit form a longitudinal array of concentric circular heating elements.

Referring again to FIG. 1, and to the sectional view shown in FIG. 2A, housing 12 further includes first heating circuit 16 and second heating circuit 18. Each heating circuit 16 and 18 includes electrical resistive heating elements, insulatory materials, and structural materials. In one embodiment, first heating circuit 16 is a longitudinal array of electrically coupled circular heating elements, with adjacent elements in longitudinal juxtaposition. As shown in FIG. 2A, first heating circuit 16 is positioned inboard of, and concentrically with, second heating circuit 18. Second heating circuit 18 is also a longitudinal array of electrically coupled circular heating elements, with adjacent elements in longitudinal juxtaposition. The electrical resistive heating elements are positioned around outer surface 17 of process chamber 14. In one embodiment, first heating circuit 16 is a controllable heating circuit, which means that the energy output or heat flux from each element of first circuit 16 may be varied during processing to a desired output level. Preferably, the first heating circuit provides a heat flux density of between approximately 0 and 6.25 watts per square centimeter of effective heating surface. Even more preferably the heat flux density is between about 0 and 3.12 watts per square centimeter. The preferred heating elements can have a conductive element having a * diameter of approximately 1 to 5 mm. The electrical resistance heating elements are preferably trained into a pattern, which provides a relatively uniform heat flux. In this embodiment, second heating circuit 18 emits a constant energy output. Preferably, second heating circuit 18 provides a constant heat flux density of between approximately 0 and 6.25 watts per square centimeter of effective heating surface, preferably between about 0 and 3.12 watts per square centimeter of effective heating surface. The preferred heating elements can have a conductive element having a diameter of approximately 1 to 5 mm. By combining a variable heat flux heating circuit 16 and a fixed heat flux heating circuit 18, fluctuations in temperature can be overcome with little added energy to the system. Also, the temperature in process chamber 14 can be kept substantially isothermal both during processing and during wafer transport.

Figure 2B:
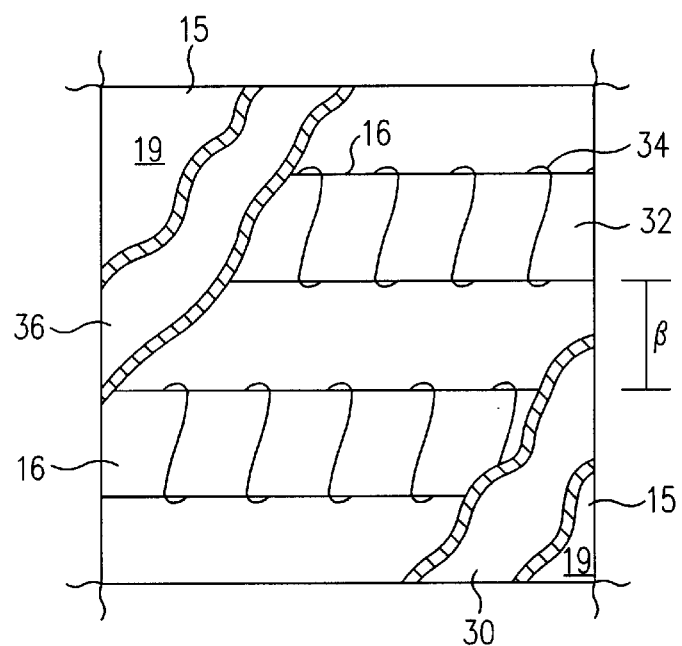
FIG. 2B is a sectional view of yet another portion of the embodiment of FIG. 2A.

Referring now to FIGS. 2A and 2B, each heating element of first and second heating circuits 16 and 18 are in relative close proximity to each other element in the circuit. For example, each longitudinal resistive heating element may be spaced a distance β from the next closest heating element, which may be between about 5 mm and 50 mm, preferably between about 10 mm and 20 mm. Each concentrically positioned heating circuit may be spaced a distance α, which may be between about 1 mm and 50 mm, preferably between about 5 mm and 20 mm. Accordingly, the close spacing of elements provides for an even heating temperature distribution across the wafers.

The resistive heating elements may be any conventional heating elements suitable for high temperature processing applications. In one embodiment, the resistive heating elements may include a resistive heating element core 32 wrapped by a filament wire 34. Core 32 is usually made of a ceramic material, but may be made of any high temperature rated, non-conductive material. The filament wire 34 is conventionally wrapped around core 32 to allow for an optimal amount of radiated heat energy to emanate from the element. The filament wire may be any suitable resistively heatable wire, which is made from a high mass material for increased thermal response and high temperature stability, such as SiC, SiC coated graphite, graphite, and AlNi. In another embodiment, the heating elements of heating circuits 16 and 18 may be formed from a powdered metallurgical material having desired electrical resistance properties. The electrical heating elements include a powdered metallurgical mixture including chromium, aluminum, iron, and yttrium. The proportions of these materials can vary as is known in the art of producing such powdered metallurgical electrical resistance heating elements. Preferably, the resistive heating elements include a filament wire made of a combination Al—Ni—Fe material, which surrounds a ceramic core, known commonly as Kantal A-1 or AF, available from Omega Corp. of Stamford, Conn. In each embodiment, the heating elements are electrically connected to a power supply system via heating element connection terminals and associated wiring (not shown).

Figure 3:
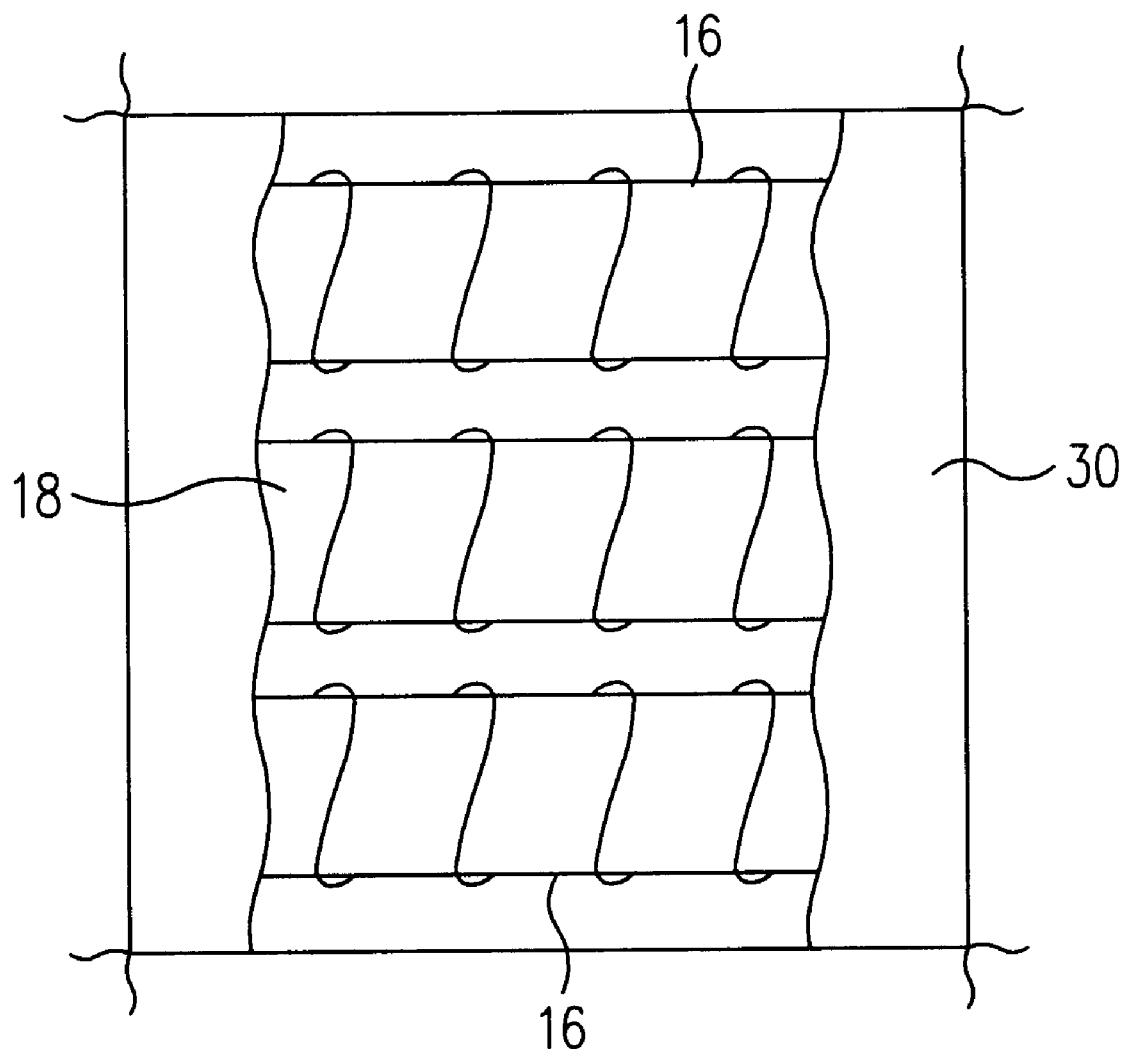
FIG. 3 illustrates an alternative embodiment of the present invention where the first heating circuit and the second heating circuit form a longitudinal array of interposed circular heating elements.

FIG. 3 shows an alternative embodiment of the present invention, in which first heating circuit 16 and second heating circuit 18 form a longitudinal array of interposed circular heating elements. The elements of first heating circuit 16 are alternately interposed between elements of second heating circuit 18 in longitudinal juxtaposition. The first and second heating circuits 16 and 18 are otherwise the same in structure and function as described above. Advantageously, in this embodiment, furnace assembly 10 may have a smaller diameter since only one ring of heating elements is used in the furnace assembly.

Referring again to FIG. 1, and to FIG. 2B, secondary insulation layers 30 are formed concentrically around a top and bottom portion of chamber 14 and in-between the first heating circuit 16 and outer surface 17 of process chamber 14. Secondary insulation layers 30 are formed of a highly insulatory material, such as fibered ceramic material or other types of ceramic fibers, which are matted together to form a relatively less dense layer having good thermal insulation properties. Secondary insulation layers 30 are preferably continuous layers. Optionally, the ring of heating circuits 16 and 18 may be partially buried into the internal insulation layers.

As again shown in FIG. 1, in yet another embodiment, furnace assembly 10 includes a heat diffusing member 36, formed concentrically around a central portion of process chamber 14 and in between secondary insulation layers 30. The central portion of the process chamber is a section of the chamber in which the wafer carrier substantially resides during processing. Heat diffusing member 36 may be positioned proximate to, and typically between, first and second heating circuits 16 and 18 and process chamber 14. Heat diffusing member 36 absorbs the thermal energy output from first and second heating circuits 16 and 18 and dissipates the heat energy evenly over the central portion of chamber 14. It should be appreciated that by using the heat diffusing member over only the central portion of chamber 14, the temperature gradient within chamber 14 is more easily isothermally maintained over this region. Heat diffusing member 36 may be any suitable heat diffusing material that has a sufficiently high thermal conductivity, preferably Silicon Carbide, $Al_2O_3$, or graphite.

In a preferred embodiment, temperature sensors 38, preferably thermocouples, are embedded within heat diffusing member 36 as well as strategically placed throughout furnace assembly 10 to provide an indication of the temperatures being developed by the heating elements contained in heating circuits 16 and 18 and to provide feedback as to the temperature conditions of the heat diffusing member 36. Thermocouples 38 may be conventional R-type or K-type thermocouples available from Omega Corporation of Stamford, Conn.

Figure 4B:
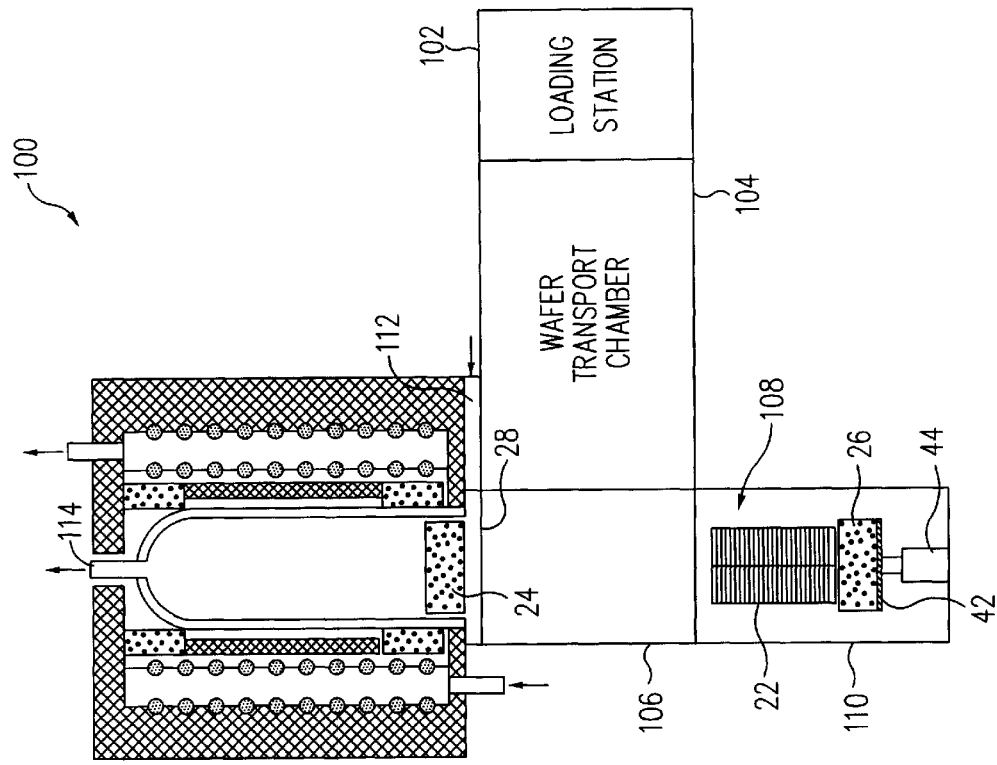
FIGS. 4A and 4B are simplified illustrations of an operational embodiment of the system of the present invention.
Figure 4A:
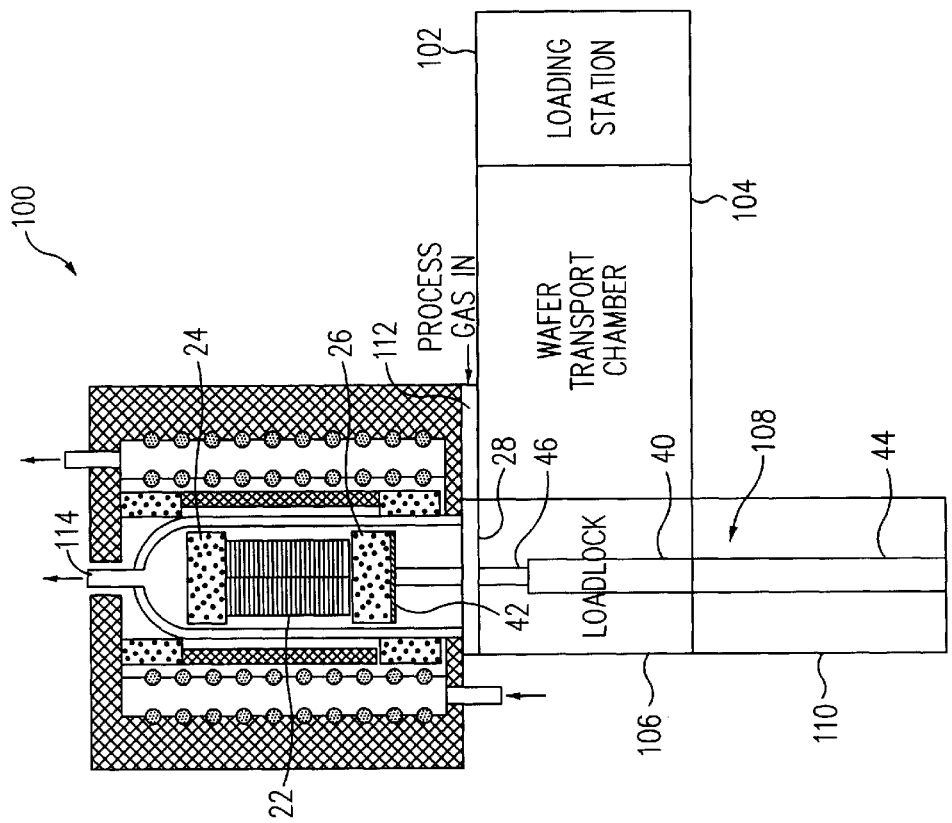

As shown in FIGS. 4A and 4B, the furnace assembly 10 is preferably operated in a thermal processing system 100 in the following manner. Besides the furnace assembly, processing system 100 includes loading station 102, wafer transport chamber 104, loadlock 108, and cooling chamber 110.

Figure 5:
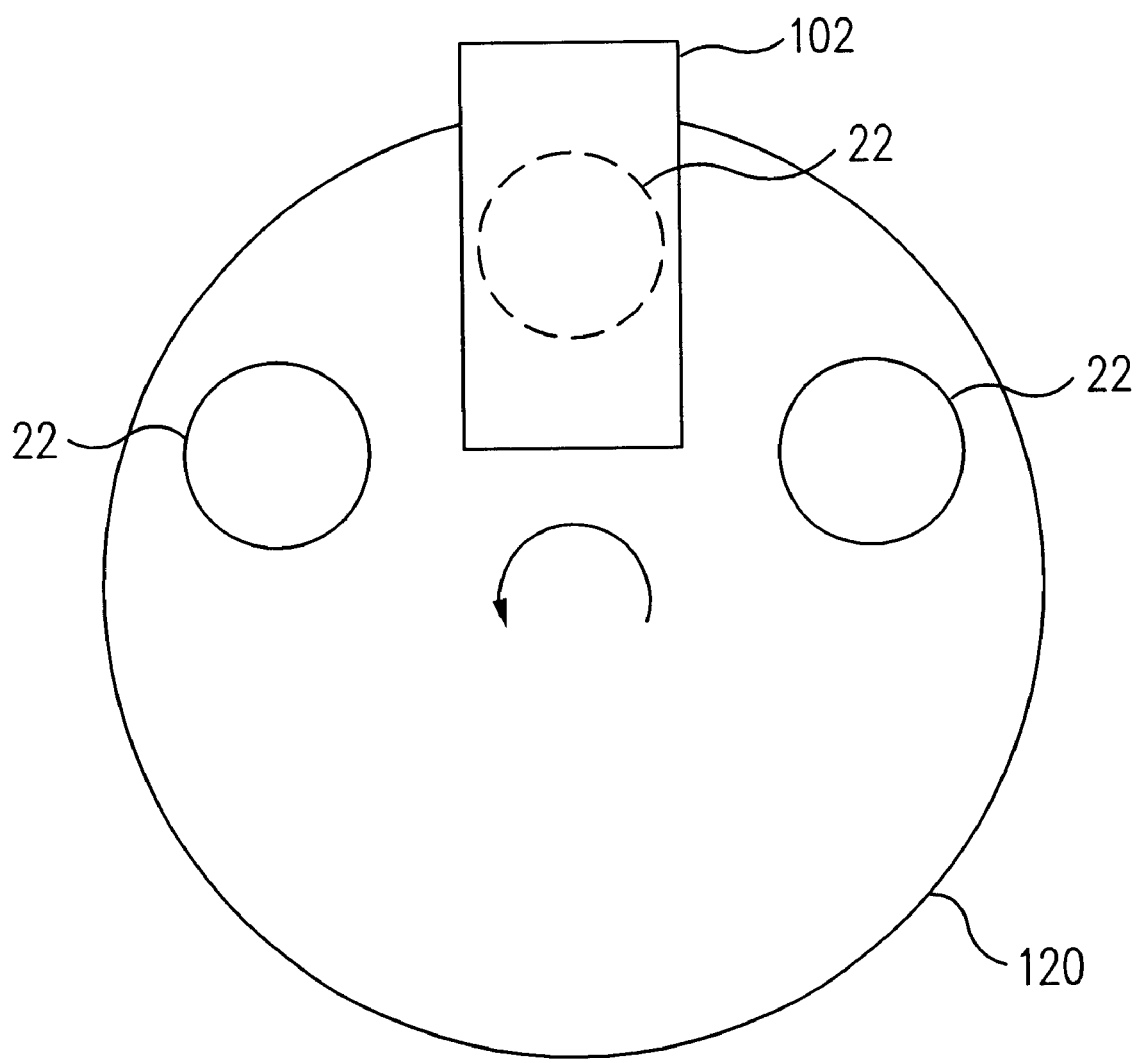
FIG. 5 is a simplified illustration of a mounting table used to load wafer carriers into the loading station according to one embodiment of the present invention.

Loading station 102 receives wafer carrier 22. The wafer carrier may be manually loaded/unloaded within loading station 102 or else may be automatically loaded/unloaded. In one embodiment, as illustrated in FIG. 5, a circular mounting table 120 may be used to systematically load wafer carriers 22 into loading station 102 at fixed time intervals. The time interval can be determined, such that after loading the initial wafer carrier, subsequent wafer carriers can be loaded, for example, while the initially loaded carrier is in the cooling chamber or in another phase of the processing system. Open locations can be provide mounting table 120 at the appropriate interval on which cooled wafer carriers can be returned after processing. The loading and unloading of processed and unprocessed wafers can be automated.

Once wafer carrier 22 is inside loading station 102, loading station 102, transfer chamber 104, and loadlock 106 are maintained at atmospheric pressure or else are pumped down to vacuum pressure using a pump (not shown). Wafer transport chamber 104 has multiple platforms for supporting and moving wafer carrier 22 from loading station 102 and into loadlock 106. In one embodiment, a robot arm or similar device within transfer chamber 104 moves toward loading station 102 and picks up wafer carrier 22. The robot arm then moves back toward loadlock 106 and deposits the wafer carrier onto wafer carrier support plate 42 through a gate valve. The robot arm then retracts and, subsequently, the gate valve closes to begin the thermal processing of the wafer batch. As further described below, support plate 42 forms part of a lift assembly 108 which is movably mounted so as to allow vertical motion between up and down positions.

Lift assembly 108 is connected to and supported by a lift actuator 40. The upper end of lift actuator 40 is secured to support plate 42. Lift actuator 40 also includes an extendible and retractable lift actuation rod 46. In a preferred embodiment, actuation rod 46 is controllably extendible relative to the main portion 44 of actuator 40. Lift actuator 40 can be any conventional type of actuator. In a preferred embodiment, actuator 40 uses a pneumatically powered ram. Alternative actuators, include electrically powered, and mechanical screw type actuators.

After the wafers in wafer carrier 22 are processed in chamber 14, lift assembly 108 retracts to lower wafer carrier 22 into a cooling chamber 110. Cooling chamber 110 cools the newly processed wafers, which may have temperatures upwards of 100° C. It should be understood that cooling chamber 110 is designed to use semiconductor wafer cooling techniques that are well known in the industry. In one embodiment, the cooling step is effected by providing or flowing a first cooling fluid flow adjacent cooling chamber 110. The first cooling fluid flow is advantageously accomplished by flowing the cooling fluid upwardly along the outside of cooling chamber 110.

A microprocessor or process control computer controls the processing of the semiconductor wafers placed in furnace assembly 10 and may be used to monitor the status of the system for diagnostic purposes. In one embodiment, a process computer provides control signals to a controller in response to temperature data received from temperature sensors 38 in furnace assembly 10. The process computer may also direct pressure setpoints to a pump assembly as well as gas and plasma inlet flow signals to mass-flow controllers in a gas network. In a preferred embodiment, the controller is a real-time PID, multi-zone controller, available from Omega Corporation. The controller provides control signals to a SCR-based phase controlled power supply, which provides power to the heating circuits.

Having thus described the preferred embodiments, persons skilled in the art will recognize that changes may be made in form and detail without departing from the spirit and scope of the invention. Thus the invention is limited only by the following claims.

What is claimed is:

1. A furnace assembly for heating a plurality of substrates, the assembly comprising:
    a furnace chamber;
    a process chamber configured to receive said plurality of substrates, said process chamber mounted in said furnace chamber in spaced relation thereto;
    a first heating circuit positioned proximate to said process chamber;
    a second heating circuit positioned proximate to said first heating circuit, a thermal energy output from said first heating circuit and said second heating circuit being capable of creating a substantially isothermal environment throughout said process chamber to heat each of said substrates;
    first insulator slidably received within said process chamber; and
    a second insulator slidably received within said process chamber,
    said first insulator and said second insulator isolating at least a portion of said process chamber as said plurality of substrates are being moved from a first position to a second position.

2. The apparatus of claim 1, wherein said first heating circuit and said second heating circuit each comprise a plurality of resistive heating elements.

3. The apparatus of claim 2, wherein each of said resistive heating elements comprises a ceramic core wrapped with a wire comprising Al—Ni—Fe.

4. The apparatus of claim 1, wherein said first heating circuit can be positioned inboard and concentric with said second heating circuit.

5. The apparatus of claim 1, further comprising a heat diffusing material proximate to said first heating circuit and said second heating circuit, said heat diffusing material causing said thermal energy output to be spread evenly over a portion of said process chamber.

6. The apparatus of claim 1, further comprising a transport mechanism for moving said plurality of substrates from between a first position within said process chamber and a second position outside of said process chamber.

7. A furnace assembly for heating a plurality of substrates, the assembly comprising:
    a furnace chamber;
    a process chamber configured to receive said plurality of substrates, said process chamber mounted in said furnace chamber in spaced relation thereto;
    a first heating circuit positioned proximate to said process chamber;

a second heating circuit positioned proximate to said first heating circuit, a thermal energy output from said first heating circuit and said second heating circuit being capable of creating a substantially isothermal environment throughout said process chamber to heat each of said substrates;

a transport mechanism for moving said plurality of substrates from a first position within said process chamber and a second position outside of said process chamber; and a first insulator and a second insulator, slidably received within said process chamber, said first insulator isolating said process chamber when said plurality of substrates is in said first position, said second insulator isolating said process chamber when said plurality of substrates is in said second position.

8. The apparatus of claim 1, wherein the thermal energy output of said first heating circuit is controllable using a PID controller.

9. The apparatus of claim 1, wherein said plurality of substrates are each housed in a substrate holding device, and wherein each substrate is separated a distance of between about 5 mm and about 50 mm from each other.

10. A system for processing a plurality of substrates, the system comprising:

a furnace chamber configured to receive a plurality of substrates for processing; and an isolation device slidably received within said furnace chamber, said isolation device causing said furnace chamber to remain substantially at a processing temperature as said plurality of substrates are transported from between a first position, internal to said furnace chamber and a second position, external to said furnace chamber.

11. The system of claim 10, wherein said system further comprises:

a process chamber received in said furnace chamber in spaced relation thereto;

a first heating circuit positioned proximate to said process chamber;

a second heating circuit positioned proximate to said first heating circuit; and a cooling chamber configured to receive said plurality of substrates after said processing, wherein a thermal energy output from said first heating circuit and said second heating circuit provides said processing temperature throughout said process chamber.

12. The system of claim 11, wherein said first heating circuit and said second heating circuit each comprise a plurality of resistive heating elements.

13. The system of claim 11, further comprising a heat diffusing material proximate to said first heating circuit and said second heating circuit, said heat diffusing material causing said thermal energy output to be spread evenly over a portion of said process chamber.

14. A system for heating a plurality of substrates, the system comprising:

furnace assembly configured to receive a plurality of substrates for processing said furnace assembly including:

a process chamber received in said furnace chamber in spaced relation thereto;

a first heating circuit positioned proximate to said process chamber; and a second heating circuit positioned proximate to said first heating circuit, a thermal energy output from said first heating circuit and said second heating circuit provide a substantially isothermal environment throughout said process chamber to heat each of said substrates;

a cooling chamber configured to receive said plurality of substrates after said processing, said furnace chamber remaining substantially at a given temperature as said plurality of substrates are transported from between a first position, within said furnace chamber and a second position, within said cooling chamber; and a first insulator and a second insulator, slidably received within said process chamber, said first insulator isolating said process chamber when said plurality of substrates is in said first position, said second insulator isolating said process chamber when said plurality of substrates is in said second position.

15. The system of claim 10, further comprising a transport mechanism for moving said plurality of substrates from said first position to said second position.

16. The system of claim 10, further comprising a loading station.

17. The system of claim 16, further comprising a loading table for loading and unloading said plurality of substrates from said loading station at a predetermined time interval.

18. A method for processing a plurality of substrates, the method comprising:

creating a substantially isothermal environment within a process chamber; and isolating at least a portion of said process chamber from an external environment to maintain said substantially isothermal environment within said process chamber while transporting a plurality of substrates from between a first position, where said plurality of substrates are inside of said process chamber, and a second position, where said plurality of substrates are outside of said process chamber.

19. The method of claim 18, wherein said second position is within a cooling chamber.

20. A method for heating a plurality of substrates, the method comprising:

transporting a plurality of substrates into a first position within a process chamber for processing;

supplying a thermal energy output from a heat source to create a substantially isothermal environment within said process chamber; and transporting said plurality of substrates to a second position, said process chamber remaining substantially isothermal during said transporting of said plurality of substrates from said first position to said second position;

said transporting of said plurality of substrates into said first position including isolating said process chamber with a first insulator.

21. The method of claim 20, wherein said transporting of said plurality of substrates into said second position comprises isolating said process chamber with a second insulator.

22. The method of claim 18, wherein said transporting of said plurality of substrates into said first position comprises isolating said process chamber with a first insulator.

23. The method of claim 18, wherein said transporting of said plurality of substrates into said second position comprises isolating said process chamber with a second insulator.

24. The apparatus of claim 1, wherein an operating temperature of said first heating circuit can be a variable temperature; and an operating temperature of said second heating circuit can be a constant temperature.

* * * * *